(12) United States Patent
Kabat

(10) Patent No.: US 6,912,131 B2
(45) Date of Patent: Jun. 28, 2005

(54) ELECTRONIC COMPONENTS CARD AIR DEFLECTOR

(75) Inventor: Zbigniew Kabat, Schaumburg, IL (US)

(73) Assignee: Lucent Technologies Inc., Murray Hill, NJ (US)

( * ) Notice: Subject to any disclaimer, the term of this patent is extended or adjusted under 35 U.S.C. 154(b) by 42 days.

(21) Appl. No.: 10/650,199

(22) Filed: Aug. 27, 2003

(65) Prior Publication Data

US 2005/0047084 A1 Mar. 3, 2005

(51) Int. Cl.$^7$ .............................. H05K 7/20; F24F 13/08
(52) U.S. Cl. .................. 361/720; 361/690; 165/104.34
(58) Field of Search ................... 361/687, 690, 361/688, 694, 720, 721; 257/712–722, E23.101, E23.102; 454/184–186; 312/236; 165/80.3, 104.34

(56) References Cited

U.S. PATENT DOCUMENTS

| | | | | |
|---|---|---|---|---|
| 4,399,485 A | * | 8/1983 | Wright et al. ............... | 361/693 |
| 4,894,749 A | * | 1/1990 | Elko et al. .................. | 361/690 |
| 5,105,336 A | * | 4/1992 | Jacoby et al. ............... | 361/690 |
| 5,282,114 A | * | 1/1994 | Stone .......................... | 361/687 |
| 5,428,503 A | * | 6/1995 | Matsushima et al. ....... | 361/695 |
| 5,694,294 A | * | 12/1997 | Ohashi et al. .............. | 361/687 |
| 5,892,654 A | * | 4/1999 | Worden, Jr. ................. | 361/690 |
| 5,914,858 A | * | 6/1999 | McKeen et al. ............ | 361/695 |
| 5,946,190 A | * | 8/1999 | Patel et al. .................. | 361/700 |
| 6,058,011 A | * | 5/2000 | Hardt et al. ................ | 361/694 |
| 6,111,748 A | * | 8/2000 | Bhatia ......................... | 361/695 |
| 6,262,891 B1 | * | 7/2001 | Wickelmaier et al. ...... | 361/695 |
| 6,483,699 B1 | * | 11/2002 | Salmonson et al. ......... | 361/687 |
| 6,556,438 B1 | * | 4/2003 | Bolognia et al. ........... | 361/687 |
| 6,556,440 B2 | * | 4/2003 | Jensen et al. ............... | 361/687 |
| 2002/0159232 A1 | * | 10/2002 | Beitelmal et al. ........... | 361/695 |
| 2003/0021088 A1 | * | 1/2003 | Jensen et al. ............... | 361/687 |
| 2003/0218862 A1 | * | 11/2003 | Dietrich et al. ............. | 361/687 |
| 2004/0100769 A1 | * | 5/2004 | Chung et al. ............... | 361/697 |

* cited by examiner

Primary Examiner—Anatoly Vortman

(57) ABSTRACT

Cooling means are provided for directing cooling air over a desired portion of an electronic components card. A deflector attachable to the electronic components card for directing cooling air over the card is provided. The deflector is adapted to be moved with respect to the card to direct cooling air over different portions of the card. The deflector includes a scoop extending along the plane of the card and beyond the edge of the card when the deflector is attached to the card for redirecting cooling air over the card. The deflector can include a pair of walls having spaced apart interior surfaces forming a channel for receiving the card for attaching the deflector to the card. A method for cooling an electronic components card includes providing a deflector having a scoop for redirecting cooling air and attaching the deflector to the card so that the scoop directs cooling air over the card to cool the electronic components. The method includes attaching the deflector at a desired location along the card edge to direct air over a desired portion of the card.

18 Claims, 4 Drawing Sheets

ELECTRONIC COMPONENTS CARD AIR DEFLECTOR

BACKGROUND OF THE INVENTION

The present invention relates to cooling electronic components and more particularly to an air deflection system for directing cooling air over an electronic components card.

Electronic components can be arranged on boards also known as cards which can be added or removed from the electronic device as needed. The electronic components are designed to operate within specific temperature ranges specified by the manufacturer. However, the electronic components create heat during operation which can cause the operational temperature ranges to be exceeded. Excessive heat build up can damage the electronic components and/or reduce their operational lifespan. The electronic components are cooled by moving the heat away. Air is often used for cooling the electronic components. The air is moved over the electronic components removing excess heat by convention.

Referring to FIGS. 1 and 2, it is common in the electronics industry to mount the electronic components 11 on printed circuit boards, also known as cards shown at 10. The cards 10 are plugged into card shelf assemblies, one of which is shown generally at 12, which form electronic devices including but not limited to cellular communication switching devices. The cards 10 can include card guides 14 extending along a card edge or along opposite card edges which are used to support the card in the shelf assembly 12 and to guide the card into mating connectors in a backplane 16 in the shelf assembly.

The shelf assembly 12 includes fans 18 for moving air shown at 19 over the cards 10 for cooling the electronic components 11. However, the air 19 can be blocked or impeded by the arrangement of the cards 10 in the shelf assembly 12. As shown in FIG. 2, the cards 10 can also include extrusions 20 which can cause turbulence by obstructing the cooling air 19 reducing the cooling effects of the airflow. A zone of reduced airflow over the card 10 can cause localized overheating on the card as shown at 22. For example, air turbulence is often created around the front face plate 23 of the card 10 which can cause the electronic components 11 in that area to overheat. Also, larger electronic components can create air turbulence and air obstructions which reduces the cooling of the other electronic components. It is desirable to improve the airflow over electronic component cards for cooling the electronic components.

SUMMARY OF THE INVENTION

According to the present invention, cooling means are provided for directing cooling air over a desired portion of an electronic components card.

In accordance with one aspect of the present invention, a deflector is provided. The deflector is attachable to the electronic components card for directing cooling air over the card.

In accordance with another aspect of the invention, the deflector is adapted to be moved with respect to the card at any time to direct cooling air over different portions of the card.

In accordance with another aspect of the invention, several deflectors can be attached to the card at different locations at one time to direct cooling air over more than just one area of the card.

In accordance with another aspect of the invention, the deflector can be used to redirect or remove cooling air from an area of the card.

In accordance with another aspect of the invention, the deflector includes a scoop extending from the deflector along the plane of the card and beyond the edge of the card when the deflector is attached to the card for redirecting cooling air over the card.

In accordance with another aspect of the invention, the deflector includes a gripping member for attaching the deflector to the card. The gripping member can include a pair of walls having spaced apart interior surfaces forming a channel for receiving the card for attaching the deflector to the card.

In accordance with another aspect of the invention, a method for cooling an electronic components card is provided. The method includes providing a deflector having a scoop for redirecting cooling air and attaching the deflector to the card so that the scoop directs cooling air over the card to cool the electronic components.

In accordance with another aspect of the invention, the method includes attaching the deflector at a desired location along the card edge to direct air over a desired portion of the card.

Other features, benefits and advantages of this invention will become apparent to those skilled in the art from the following detailed description of the preferred embodiments, when read in light of the accompanying drawings.

BRIEF DESCRIPTION OF THE DRAWINGS

The drawings are only for purposes of illustrating preferred embodiments and are not to be construed as limiting the invention. The invention may take form in various components and arrangements of components, and in various steps and arrangements of steps, preferred embodiments of which will be illustrated in the accompanying drawings wherein.

DETAILED DESCRIPTION OF THE INVENTION

It is to be understood that the specific devices and processes illustrated in the attached drawings, and described in the following specification are simply exemplary embodiments of the inventive concepts defined in the appended claims. Hence, specific examples and characteristics relating to the embodiments disclosed herein are not to be considered as limiting, unless the claims expressly state otherwise.

Figure 1:
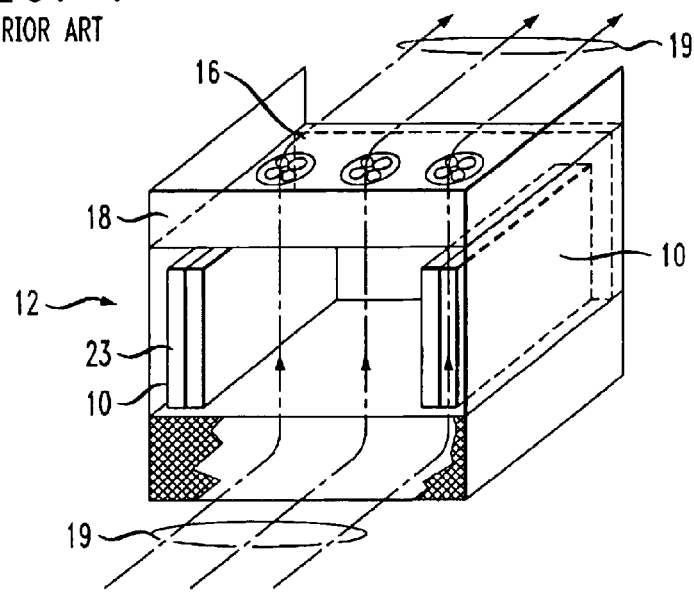
FIG. 1 is perspective view diagram illustrating a known card shelf assembly having a plurality of cards and a cooling air system.
Figure 2:
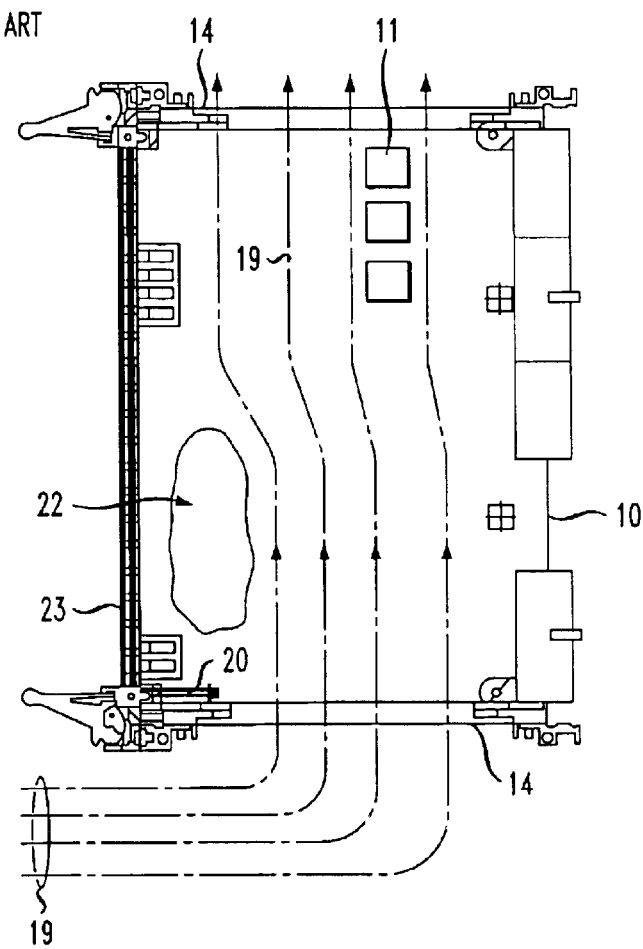
FIG. 2 is a diagram illustrating the cooling airflow over a card not using the invention.
Figure 3:
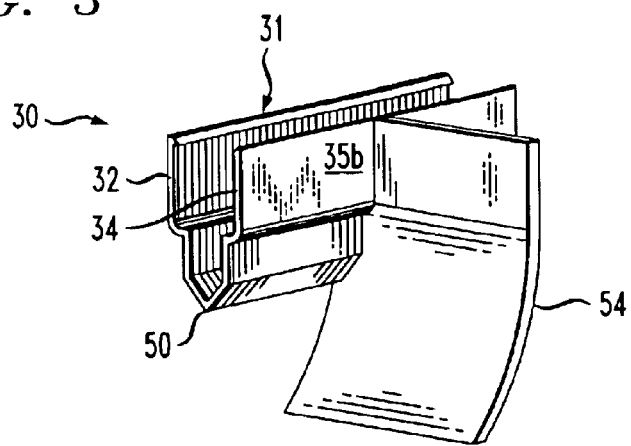
FIG. 3 is a perspective view of the air deflector in accordance with the invention.
Figure 4:
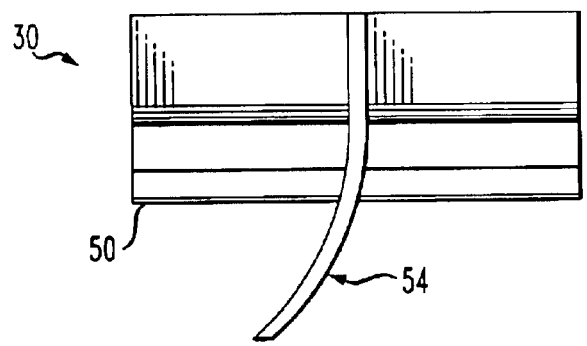
FIG. 4 is a side view of the air deflector in accordance with the invention.
Figure 5:
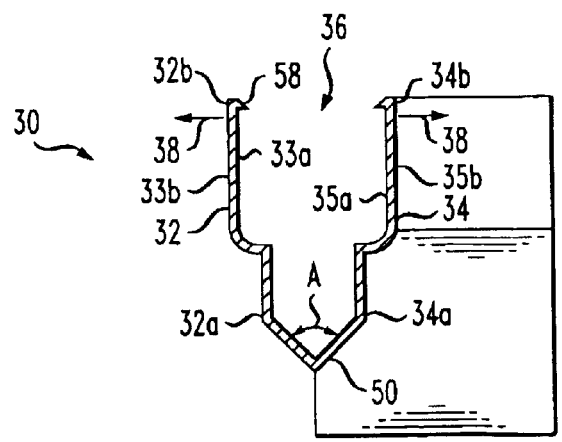
FIG. 5 is sectional elevational view of the air deflector in accordance with the invention.

Referring to FIGS. 3–5, a cooling air deflector for an electronic component card is shown generally at 30. The deflector 30 includes a gripping member 31 for attaching the deflector 30 to the electronic components card. The gripping member 31 can be any suitable gripping member for attaching the deflector to the card 10. In one example, which should not be considered limiting, the gripping member can include a pair of walls 32 and 34 having interior surfaces 33a and 35a facing each other. The interior surfaces 33a, 35a are spaced apart to form a channel 36 therebetween for receiving a portion of the card 10 or card guide 14 for attaching the deflector 30 to the card as described below.

The walls 32, 34 include first ends 32a and 34a connected together by a hinge 50. The hinge 50 biases the interior surfaces 33 and 35 apart from each other in a spaced apart configuration to form the channel 36. The hinge 50 is flexible, allowing the second ends 32b and 34b of the walls 32 and 34 to be moved apart as shown by arrows 38 to widen the channel 36 using outwardly directed forces applied to the walls. The hinge 50 biases the walls 32 and 34 back towards each other and the spaced apart configuration after the outwardly directed forces against the walls are removed. The hinge 50 can form an angle, such as angle A shown in FIG. 5, to improve the airflow over the hinge.

The deflector 30 includes a scoop 54 extending from an exterior surface 33b, 35b of one or both walls 32, 34. The scoop 54 can be straight, or curved, or it can have any shape suitable for redirecting air as described herein. The deflector 30 can be formed of plastic, including any suitable known plastic, or any other suitable rigid material. The deflector 30, walls 32, 34, hinge 50 and scoop 54 can be formed from a single piece of material, such as extruded plastic.

Figure 6:
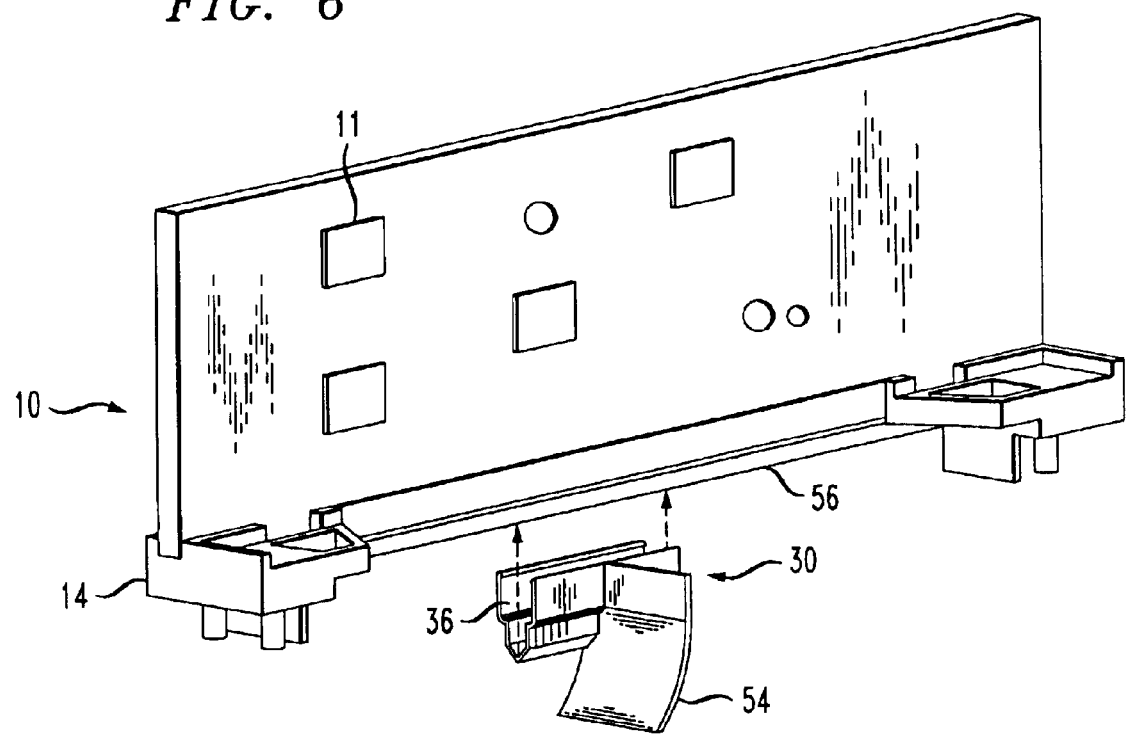
FIG. 6 is perspective view of the air deflector attaching to an electronic components card in accordance with the invention.
Figure 7:
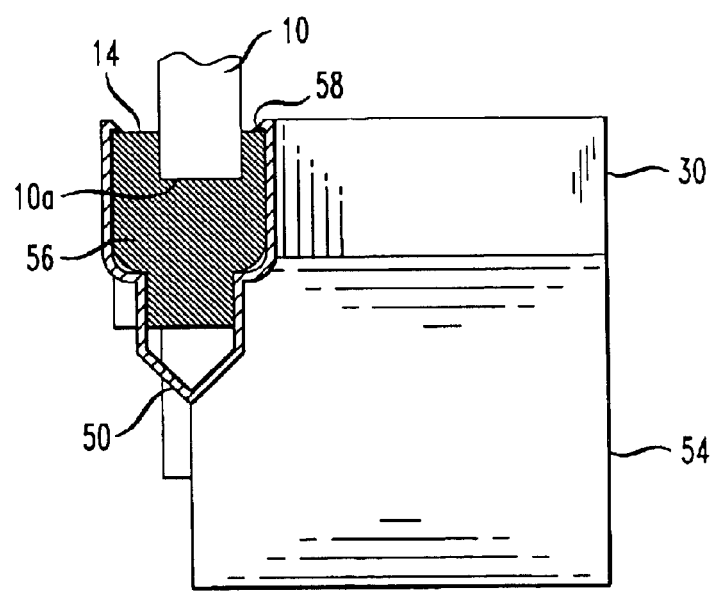
FIG. 7 sectional elevational view of the air deflector attached to the electronic components card guide in accordance with the invention.

Referring now to FIGS. 6 and 7, the deflector 30 attaches to the card 10 by inserting a portion of the card into the gripping member 31. For example, in the embodiment shown, the card 10 is received in the channel 36. In one way of attaching the deflector 30 to the card, the card edge 10a is received in the channel 36. In another way of attaching the deflector 30 to the card 10, a portion of the card guide 14 is received in the channel 36. Typically the card guide 14 extends along the card edge 10a.

The card guide 14 can include a rail 56, extending along the card edge 10a, which can be received in the channel 36 for attaching the deflector 30 to the card 10. The interior surfaces 33a and 35a of the walls 32 and 34 can have a shape which conforms to the surface of the card 10, card guide 14 and/or card guide rail 56 to improve the fit between the gripping member 31 and the card to reduce unwanted movement of the deflector 30.

The gripping member 31 can include one or more clips 58 extending over the portions of the card 10 and/or card guide 14 received in the channel 36 to maintain the attachment of the deflector 30 to the card 10. The clip 58 extends into the channel 36 from a second end 32b, 34b of an interior surface 33a, 35a of at least one of the walls 32, 34. A pair of clips 58 each extending from opposite interior surfaces 33a, 35a of the walls 32, 34 into the channel 36 can be used to maintain the attachment of the deflector 30 to the card 10.

The scoop 54 extends away from the channel 36 past the hinge 50. When the deflector 30 is attached to the card 10 and/or card guide 14, the scoop 54 extends beyond the card 10 in the direction along the plane of the card as shown in FIGS. 7 and 8.

Figure 8:
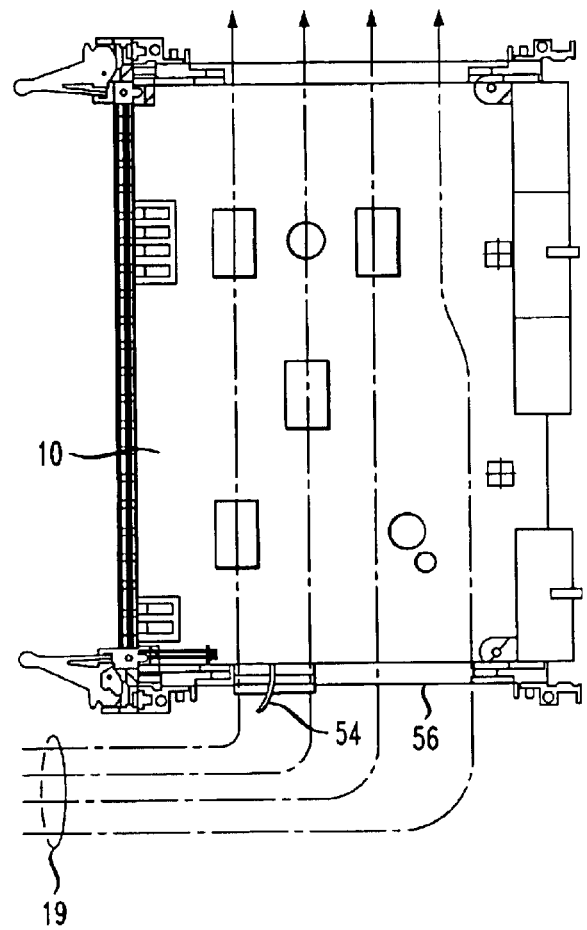
FIG. 8 is a diagram illustrating the cooling airflow over a card with the air deflector attached.

Referring to FIG. 8, the improved cooling airflow over a card 10 created by the invention is shown. The scoop 54 redirects airflow 19 over the card to cool the electronic components as shown. The invention reduces turbulence in airflow near the card faceplate 23 to reduce and/or eliminate zones of localized overheating 22. The air deflector 30 can be placed on one or both of the card guides 14. The scoop 54 can direct cooling air in a direction over the card or heated air to a direction away from other components or out of the shelf assembly to improve the cooling airflow depending on the direction of the cooling air in the shelf assembly 12. More than one air deflector 30 can be mounted on a single card to provide additional airflow over more than one area of the card.

Figure 9:
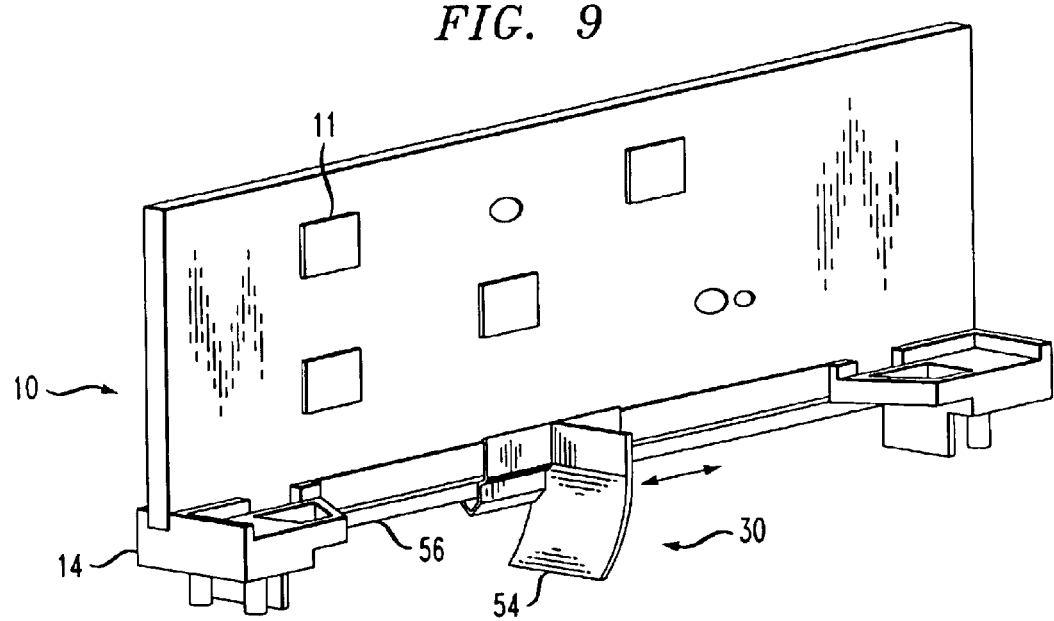
FIG. 9 is perspective view of the air deflector which is movable relative to the electronic components card in accordance with the invention.

Referring now to FIG. 9, the deflector 30 can be moved with respect to the card 10 to change the location of the scoop 54 on the card when the deflector is attached to the card. Attaching the deflector 30 to the card at a specific location along the card edge 10a enables the scoop 54 to direct air over a specific portion of the card to eliminate a zone of overheating 22. Moving the deflector 30 relative to the card 10 enables the deflector to direct cooling air to different portions of the card. The deflector 30 can be moved relative to the card 10 by sliding the deflector along the card edge, such as along the card guide 14 and/or the card guide rail 56, or attaching gripping member 31 to different locations along the card edge 10a and/or card guide 14.

The invention has been described with reference to preferred embodiments. Obviously, modifications and alterations will occur to others upon reading and understanding the preceding specification. It is intended that the invention be construed as including all such modifications and alterations insofar as they come within the scope of the appended claims or the equivalents thereof.

We claim:

1. A deflector attachable to an electronic components card and having a scoop for directing airflow over the card for cooling electronic components mounted to the card, wherein the scoop extends from the deflector along the card plane and beyond the card edge when the deflector is attached to the card for redirecting cooling air over the card.

2. The deflector defined in claim 1 wherein the deflector is movable with respect to the card for changing the location of the scoop with respect to the card to direct cooling air to different portions of the card.

3. The deflector defined in claim 1 further comprising a gripping member for attaching the deflector to the card.

4. The deflector defined in claim 3 herein the gripping member comprises a pair of walls having spaced apart interior surfaces forming a channel for receiving the card for attaching the deflector to the card.

5. The deflector defined in claim 4 wherein the gripping member further comprises a hinge connecting first ends of the walls together, the hinge biasing the walls into a spaced apart arrangement to form the channel.

6. The deflector defined in claim 5 wherein the hinge is flexible to enable the first ends of the walls to be moved apart to widen the channel.

7. The deflector defined In claim 6 wherein the gripping member further comprises a clip for retaining the card in the channel to maintain attachment of the deflector to the card.

8. The deflector defined in claim 7 wherein the clip extends into the channel from a second end of the interior surface of at least one of the walls.

9. The deflector defined in claim 8 wherein the gripping member further comprises a pair of clips disposed on opposite interior surfaces of the walls and extending into the channel, each clip extending from a first end of the interior surface of a wall.

10. The deflector defined in claim 1 wherein the deflector is attachable to an electronic components card edge.

11. The deflector defined in claim 1 wherein the deflector is attachable to an electronic components card guide.

12. The deflector defined in claim 11 wherein the deflector is attachable to an electronic components card guide rail.

13. A method of cooling electronic components mounted to an electronic components card, the method comprising:

providing a deflector having a scoop for redirecting cooling air; and attaching the deflector to the card so that the scoop extends beyond the card edge and directs cooling air over the card to cool the electronic components.

14. The method defined in claim 13 wherein the attaching step includes attaching the deflector at a desired location along the card edge to direct air over a desired portion of the card.

15. The method defined in claim 13 comprising:

providing a plurality of deflectors, each having a scoop for redirecting cooling air; and attaching the plurality of deflectors to the card so that the scoops direct cooling air over the card to cool the electronic components.

16. An electronic components card having electronic components mounted thereon comprising:

a deflector having a gripping member for attaching the deflector to the card and a scoop extending beyond the card edge for directing cooling air over the card for cooling the electronic components.

17. The electronic components card defined in claim 16 wherein the deflector is movable with respect to the card for directing cooling air to different portions of the card.

18. The electronic components card defined in claim 16 wherein the gripping member further comprises:

a pair of walls having spaced apart interior surfaces forming a channel for receiving the card for attaching the deflector to the card; and a hinge connecting first ends of the walls together, the hinge biasing the walls into a spaced apart arrangement to form the channel.

* * * * *